(12) United States Patent  
Cinar et al.

(10) Patent No.: US 11,670,570 B2  
(45) Date of Patent: Jun. 6, 2023

(54) ELECTRONIC DEVICE AND METHOD OF MANUFACTURING AN ELECTRONIC DEVICE

(71) Applicant: Samsung Electronics Co., Ltd., Suwon-si (KR)

(72) Inventors: Yusuf Cinar, Yongin-si (KR); Jaehong Park, Suwon-si (KR); Seongyun Baek, Suwon-si (KR); Hanhong Lee, Suwon-si (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 398 days.

(21) Appl. No.: 16/870,068

(22) Filed: May 8, 2020

(65) Prior Publication Data

US 2020/0373221 A1   Nov. 26, 2020

(30) Foreign Application Priority Data

May 22, 2019   (KR) .................. 10-2019-0059920  
Jul. 12, 2019   (KR) .................. 10-2019-0084219

(51) Int. Cl.
| | |
|---|---|
| *H01L 23/427* | (2006.01) |
| *H01L 23/00* | (2006.01) |
| *H01L 25/065* | (2023.01) |
| *H01L 21/52* | (2006.01) |
| *H01L 21/48* | (2006.01) |

(52) U.S. Cl.
CPC ........ *H01L 23/427* (2013.01); *H01L 21/4871* (2013.01); *H01L 21/52* (2013.01); *H01L 24/32* (2013.01); *H01L 24/83* (2013.01); *H01L 25/0655* (2013.01); *H01L 2224/32245* (2013.01); *H01L 2924/1443* (2013.01)

(58) Field of Classification Search
CPC .... H01L 23/427; H01L 21/4871; H01L 21/52  
See application file for complete search history.

(56) References Cited

U.S. PATENT DOCUMENTS

| | | |
|---|---|---|
| 8,547,703 B2 | 10/2013 | Aoki et al. |
| 9,024,434 B2 | 5/2015 | Im et al. |
| 9,061,941 B2 | 6/2015 | Kang et al. |
| 9,226,428 B2 | 12/2015 | Pidwerbecki et al. |
| 9,648,735 B2 | 5/2017 | Mahler et al. |

(Continued)

FOREIGN PATENT DOCUMENTS

| | | |
|---|---|---|
| CN | 101073761 A | 11/2007 |
| CN | 102054196 A | 5/2011 |

(Continued)

OTHER PUBLICATIONS

Office Action dated Oct. 9, 2022 for corresponding Chinese Patent Application No. 202010429423.2.

(Continued)

*Primary Examiner* — Errol V Fernandes  
(74) *Attorney, Agent, or Firm* — Harness, Dickey & Pierce, P.L.C.

(57) ABSTRACT

An electronic device includes a substrate, at least one electronic element on the substrate, a heat dissipating pad on the substrate in thermal contact with the at least one electronic element, and including an encapsulated phase change material therein, and a bracket covering the substrate, the at least one electronic element and the heat dissipating pad.

20 Claims, 11 Drawing Sheets

(56) References Cited

U.S. PATENT DOCUMENTS

| | | | |
|---|---|---|---|
| 9,799,585 B2 | 10/2017 | Weng et al. | |
| 9,918,407 B2 | 3/2018 | Rosales et al. | |
| 10,008,394 B2 | 6/2018 | Busche et al. | |
| 10,121,725 B2 | 11/2018 | Zhao et al. | |
| 2004/0252454 A1* | 12/2004 | Chen | G06F 1/203 |
| | | | 361/708 |
| 2005/0045372 A1 | 3/2005 | Hill | |
| 2010/0073864 A1* | 3/2010 | Hwang | H01L 23/427 |
| | | | 165/185 |
| 2012/0280382 A1* | 11/2012 | Im | H01L 23/3128 |
| | | | 257/E23.11 |
| 2013/0141866 A1* | 6/2013 | Refai-Ahmed | H01L 23/3672 |
| | | | 361/679.54 |
| 2016/0029511 A1 | 1/2016 | Jung et al. | |
| 2016/0307819 A1 | 10/2016 | Nigen et al. | |
| 2018/0068926 A1 | 3/2018 | Krajniak et al. | |

FOREIGN PATENT DOCUMENTS

| | | |
|---|---|---|
| CN | 102470641 A | 5/2012 |
| CN | 102618223 A | 8/2012 |
| CN | 203327471 U | 12/2013 |
| CN | 103488262 A | 1/2014 |
| CN | 104227913 A | 12/2014 |
| CN | 105828551 A | 8/2016 |
| KR | 101465616 B1 | 11/2014 |

OTHER PUBLICATIONS

Chinese Office Action dated Mar. 10, 2023 for corresponding CN Patent Application No. 202010429423.2.

\* cited by examiner

ELECTRONIC DEVICE AND METHOD OF MANUFACTURING AN ELECTRONIC DEVICE

PRIORITY STATEMENT

This application claims priority under 35 U.S.C. § 119 to Korean Patent Application Nos. 10-2019-0059920 and 10-2019-0084219, filed on May 22, 2019 and Jul. 12, 2019, respectively, in the Korean Intellectual Property Office (KIPO), the contents of which are herein incorporated by reference in their entirety.

BACKGROUND

1. Field

Example embodiments relate to an electronic device and a method of manufacturing the electronic device. More particularly, example embodiments relate to an electronic device such as a portable storage device (SSD) and a method of manufacturing the electronic device.

2. Description of the Related Art

As electronic products have become miniaturized and functionalized, thermal stability of the electronic products is further required. For example, in case of the electronic products such as portable storage devices (SSDs), smart phones, and laptops, heat generated from internal electronic components may be dissipated through a heat sink, a thermal interface material (TIM), etc. However, when a user uses the electronic product, the user may feel discomfort caused by a higher temperature on the product surface.

SUMMARY

Example embodiments provide an electronic device capable of efficiently storing and/or dissipating heat generated from internal electronic elements.

Example embodiments provide a method of manufacturing an electronic device.

According to example embodiments, an electronic device includes a substrate, at least one electronic element on the substrate, a heat dissipating pad on the substrate in thermal contact with the at least one electronic element, and including an encapsulated phase change material therein, and a bracket covering the substrate, the at least one electronic element and the heat dissipating pad.

According to example embodiments, an electronic device includes a substrate, at least one electronic element on the substrate, a heat dissipating pad on the substrate in thermal contact with the at least one electronic element, and including a thermal conductive material layer covering the at least one electronic element and a plurality of phase change particles in the thermal conductive material layer, and a bracket covering the substrate.

According to example embodiments, a portable solid state drive includes a substrate, a plurality of non-volatile memory devices on the substrate, a heat dissipating pad on the substrate in thermal contact with the non-volatile memory devices, and including a thermal conductive material layer and a plurality of phase change particles in the thermal conductive material layer, a bracket covering the substrate, a plurality of the non-volatile memory devices and the heat dissipating pad, and a casing surrounding the bracket.

According to example embodiments, an electronic device may include a heat dissipating pad configured to absorb and/or release heat from internal electronic elements. The heat dissipating pad may include a phase change material (encapsulated PCM) encapsulated in a thermal conductive material layer which is in thermal communication with the electronic element. A plurality of phase change particles of the phase change material may be surrounded by capsules in the thermal conductive material layer. The phase change material in a solid state may have a first heat capacity coefficient, and the phase change material in a liquid state may have a second heat capacity coefficient higher than the first heat capacity coefficient. Accordingly, a heat capacity of the heat dissipating pad may be increased according to an increase in temperature due to heat from hot electronic elements.

Thus, the heat dissipating pad may postpone the time for entering thermal throttling to thereby control skin temperature of the electronic device, that is, temperature of the surface of the casing. Due to this, even when the electronic element is operated at a higher temperature, discomfort felt by the user due to higher temperature at a specific portion outside the electronic device may be reduced or eliminated.

BRIEF DESCRIPTION OF THE DRAWINGS

Example embodiments will be more clearly understood from the following detailed description taken in conjunction with the accompanying drawings.

FIGS. 1 to 13 represent non-limiting, example embodiments as described herein.

DETAILED DESCRIPTION OF EXAMPLE EMBODIMENTS

Hereinafter, example embodiments will be explained in detail with reference to the accompanying drawings.

Figure 1:
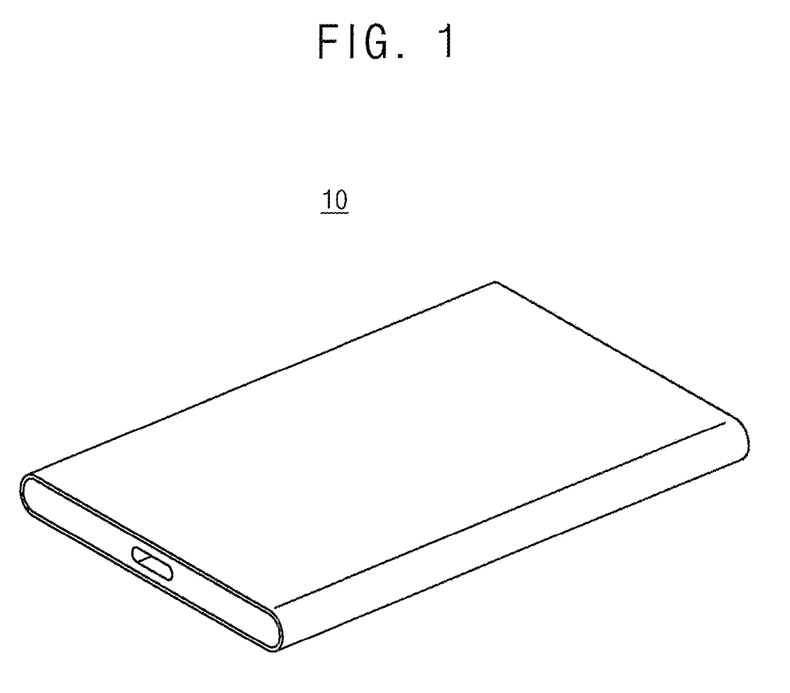
FIG. 1 is a cross-sectional view illustrating an electronic device in accordance with example embodiments.
Figure 2:
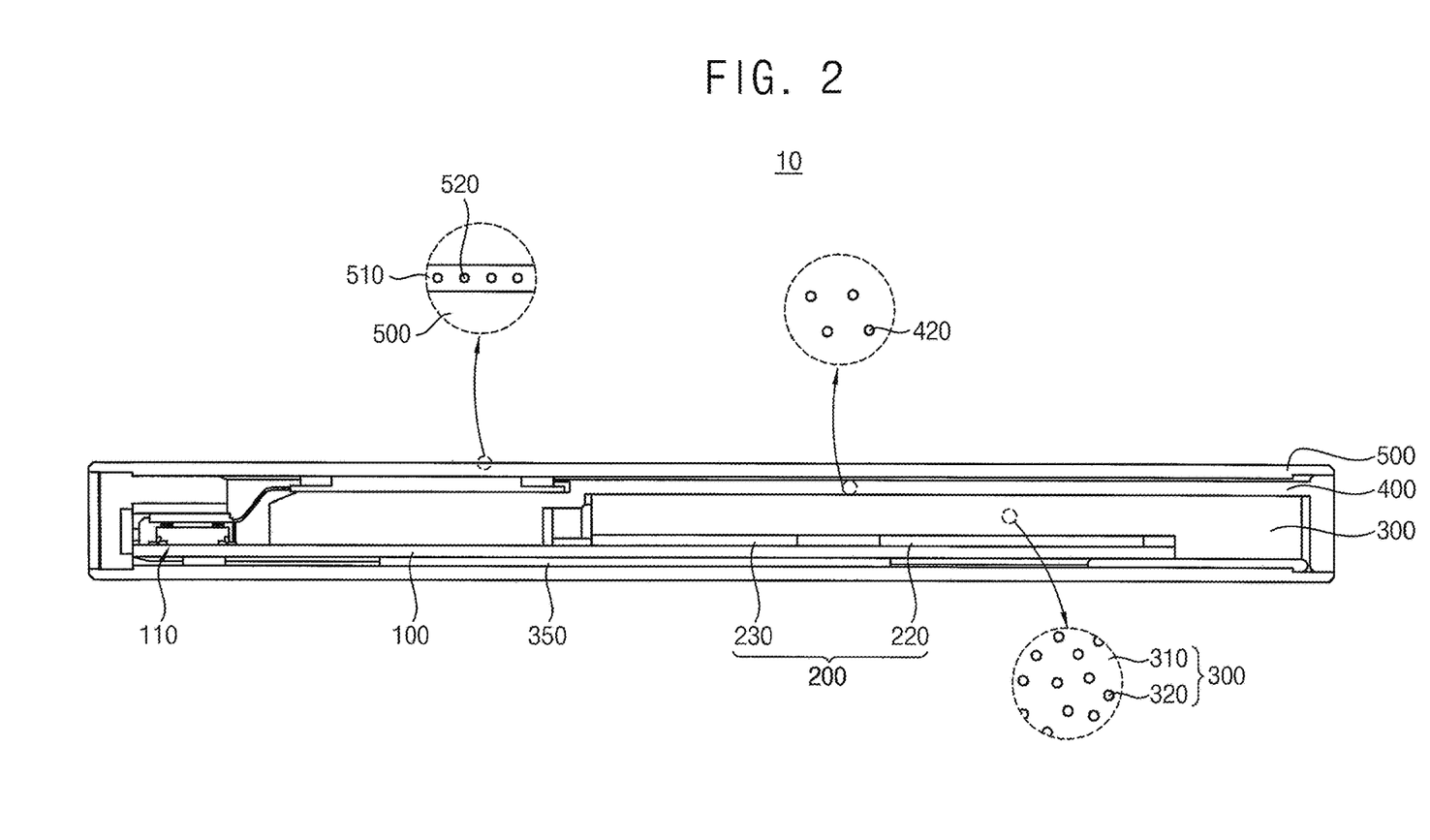
FIG. 2 is a cross-sectional view illustrating the electronic device in FIG. 1.
Figure 3:
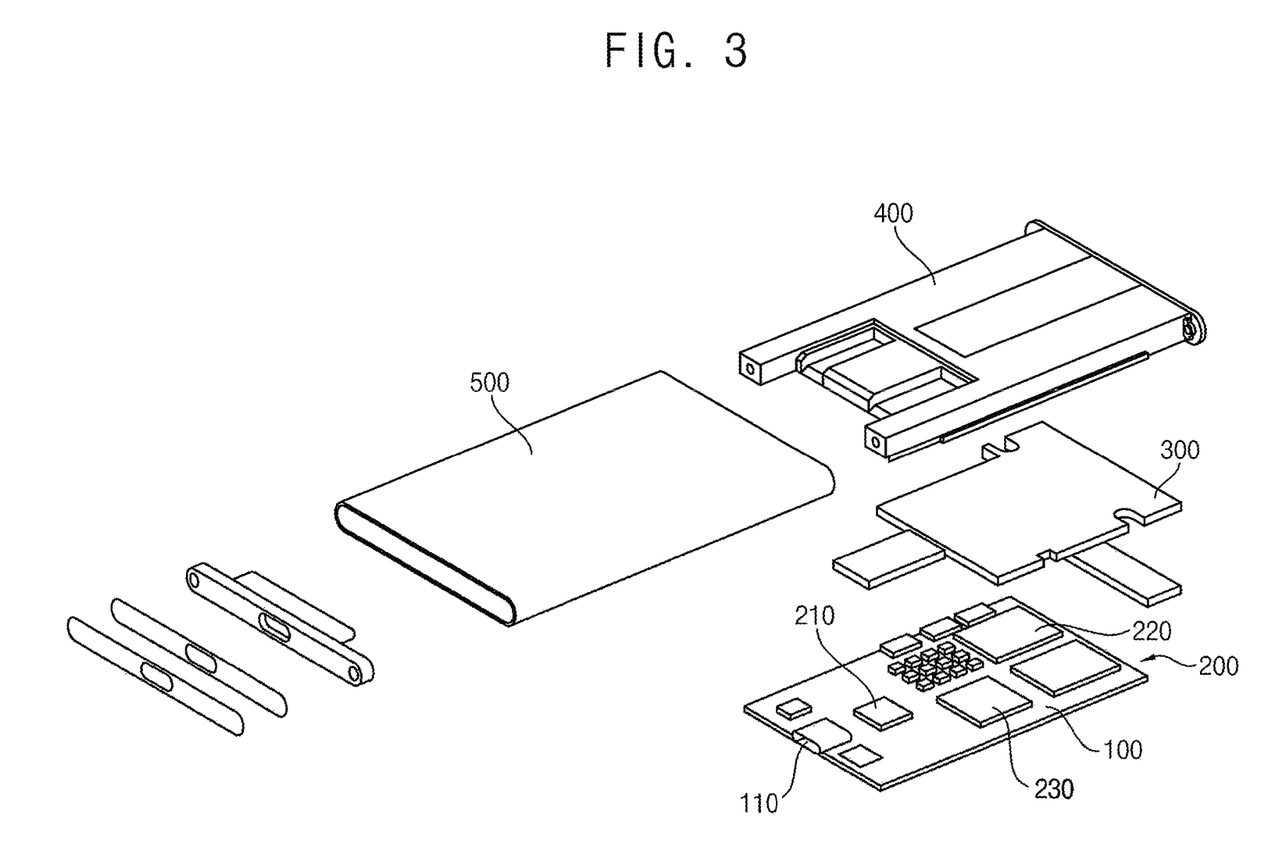
FIG. 3 is an exploded perspective view illustrating the electronic device in FIG. 1.
Figure 4:
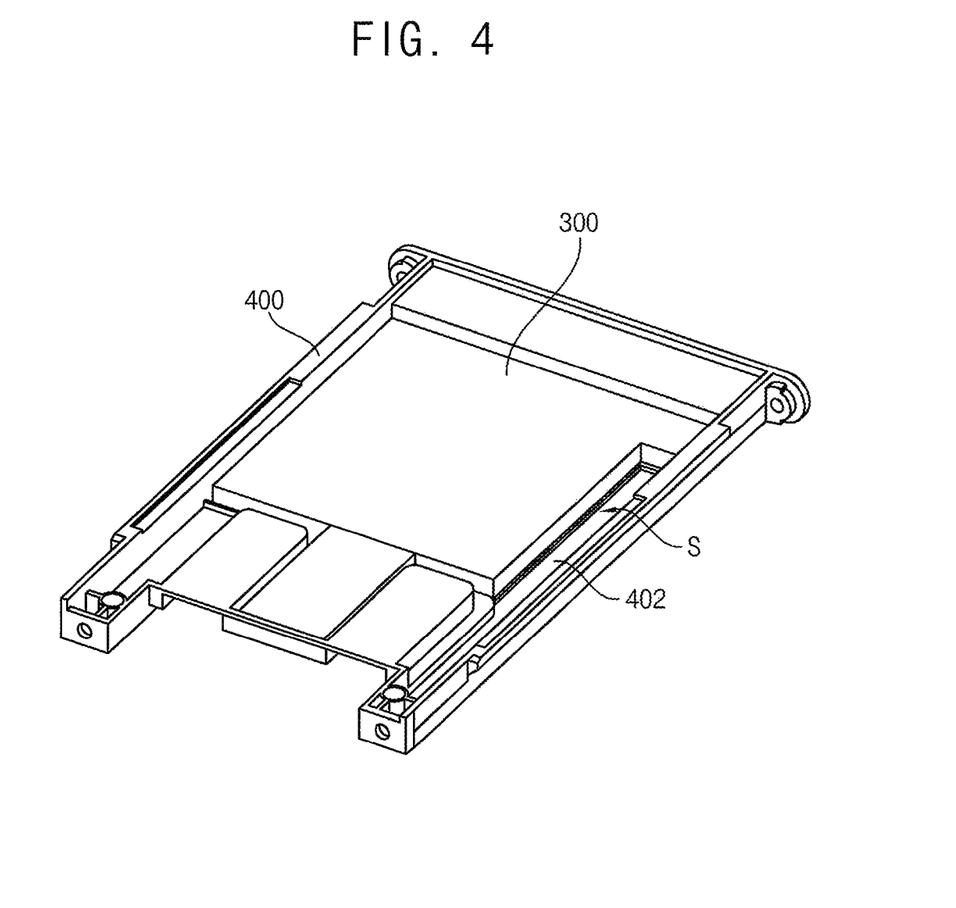
FIG. 4 is a perspective view illustrating a heat dissipating pad disposed on a bracket of the electronic device in FIG. 1.

FIG. 1 is a cross-sectional view illustrating an electronic device in accordance with example embodiments. FIG. 2 is a cross-sectional view illustrating the electronic device in FIG. 1. FIG. 3 is an exploded perspective view illustrating the electronic device in FIG. 1. FIG. 4 is a perspective view illustrating a heat dissipating pad disposed on a bracket of the electronic device in FIG. 1. FIGS. 5 to 8 are views illustrating various structures of the heat dissipating pad in FIG. 4.

Referring to FIGS. 1 to 8, an electronic device 10 may include a substrate 100, at least one electronic element 200 mounted on the substrate 100, a heat dissipating pad 300 disposed on the electronic element 200 and being in thermal communication with the electronic element 200, and/or a bracket 400 covering the substrate 100, the electronic element 200 and the heat dissipating pad 300. Additionally, the electronic device 10 may further include a casing 500 surrounding the bracket 400.

In example embodiments, the substrate 100 may be a single-layered or multi-layered circuit substrate having an upper surface and a lower surface opposite to each other. For example, the substrate 100 may be a printed circuit board (PCB). The PCB may include wirings and vias connected to the wirings. The wirings may include printed circuit patterns for interconnection with the electronic elements.

The substrate 100 may extend in a first direction (lengthwise direction). The substrate 100 may have a rectangular or square shape. The substrate 100 may have a first side portion and a second side portion opposite to each other. A connector 110 having connection terminals for connection with a host system (not illustrated) may be provided in the first side portion of the substrate 100.

In example embodiments, a plurality of the electronic elements may be mounted on the substrate 100. The electronic products may include an SSD controller 210, non-volatile memory devices 220 and/or a buffer memory device 230. The electronic elements may be mounted on the substrate 100 along the first direction to be provided as solid state drive (SSD). The electronic device 10 may be used as a portable SSD for replacing a hard disk in a PC, notebook, etc. The SSD may be used in a mobile device such as smart phone, tablet PC, digital camera, MP3 player, PDA, etc.

The electronic device 10 may be attached to or detached from the host system through the connector 110. For example, the host system may be notebook computer or netbook. The connector 110 of the substrate 100 may include a female connector. Accordingly, the electronic device 10 may be electrically connected to the host system through the connector.

The SSD controller 210 may communicate a signal with the host using a host interface. The host interface may include a universal serial bus (USB), a small computer system interface (SCSI), a PCI express, an ATA, a parallel ATA, a serial ATA, a serial attached SCSI, etc. In example embodiments, the signal communicated between the SSD controller 210 and the host may include a command, an address, data, etc. The SSD controller 210 may analyze and process the signal inputted from the host.

A plurality of the non-volatile memory devices 220 may be positioned adjacent to the side portion opposite to the connector 110 on the upper surface of the substrate 100. For example, two non-volatile memory devices 220 may be disposed on the upper surface of the substrate 100. Although not illustrated in the figures, the non-volatile memory devices may be additionally disposed on the lower surface of the substrate 100.

The non-volatile memory devices 220 may be used as a storage medium of the SSD. For example, the non-volatile memory device 220 may include NAND flash memories. The non-volatile memory devices 220 may be connected to the SSD controller 210 through at least one channel CH. The SSD may use non-volatile memories such as PRAM, MRAM, ReRAM, FRAM, etc. as the storage medium in place of flash memory.

The buffer memory device 230 may be positioned adjacent to the SSD controller 210 on the upper surface of the substrate 100. The buffer memory device 230 may be used as a buffer area temporarily storing data received from the host or temporarily storing data read from the non-volatile memory devices 220. Additionally, the buffer memory device 230 may be used to drive software used for an effective management of the non-volatile memory devices 220. Further, the buffer memory device 230 may be used to store meta data received from the host and/or may be used to store cache data.

For example, the buffer memory device 230 may include a plurality of DRAM packages. The DRAM package may include a package substrate and at least one DRAM chip mounted on the package substrate. The SSD may be embodied by replacing the DRAM with volatile memories such as SRAM, etc. or non-volatile memories such as flash memory, FRAM, MRAM, ReRAM, FRAM, etc.

Although not illustrated in the figures, the electronic device 10 may further include a power management IC (PMIC) for adjusting a power applied to the electronic elements or passive devices such as capacitor.

In example embodiments, the heat dissipating pad 300 may cover the electronic elements 200 on the substrate 100 and may be in thermal communication with the electronic elements 200 to dissipate heat coming from the electronic elements 200 to the environment, e.g., outside. The heat dissipating pad 300 may have a plurality of pad portions. The pad portions may cover different electronic elements 200. For example, a first pad portion may cover an upper surface of the electronic element 200 and a second pad portion may cover a side surface of the electronic element 200.

The heat dissipating pad 300 may include a thermal conductive material layer 310 covering the electronic element 200 and an encapsulated phase change material (Encap. PCM) 320 encapsulated in the thermal conductive material layer 310. The phase change material 320 may absorb or release heat when the phase change material 320 goes through a change in its physical state, e.g. from solid to liquid and vice versa.

For example, the phase change material 320 may include a high heat capacity material. The heat dissipating pad 300 may include the high heat capacity material in a range of about 20% to about 95% based on a total weight. A phase change temperature of the phase change material 320 may be in a temperature range between about 10° C. and about 100° C. The thermal conductive material layer 310 may include a silicon material or a thermosetting material. The thermosetting material may include a thermal interface material (TIM). The phase change material 320 may include paraffin, wax, oil, etc. The phase change material 320 may have a relatively lower thermal conductivity. The thermal conductive material layer 310 may have a thermal conductivity higher than that of the phase change material 320.

When the thermal conductive material layer 310 is heated to, for example, 40° C. by heat from the electronic elements 200, the phase change material 320 may undergo a phase transition from solid to liquid. The phase change material 320 in solid state may have a first heat capacity coefficient, and the phase change material in liquid state may have a second heat capacity coefficient, higher than the first heat capacity coefficient. The phase change material 320 in liquid state may have a heat capacity coefficient higher than that of the thermal conductive material of the thermal conductive material layer 310. Thus, a heat capacity of the heat dissipating pad 300 may be increased according to an increase in temperature due to the heat from the hot electronic elements.

Figure 5:
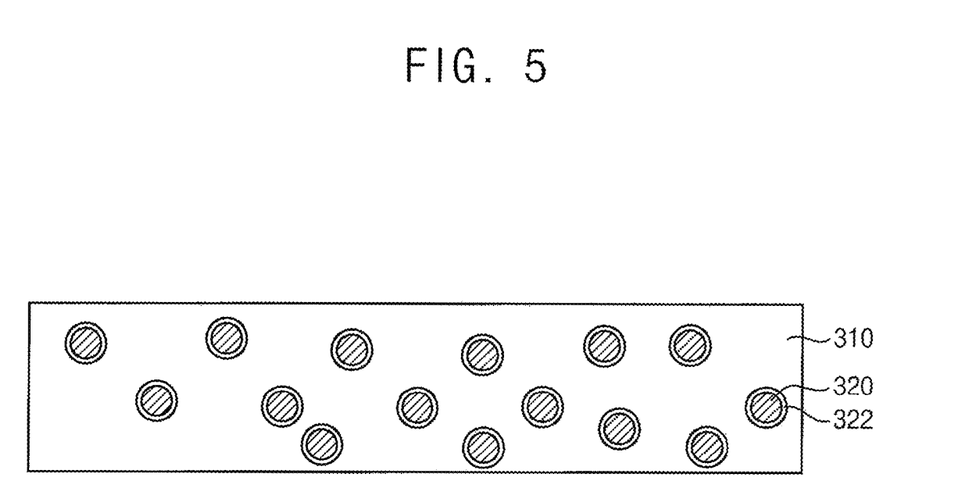
FIGS. 5 to 8 are views illustrating various structures of the heat dissipating pad in FIG. 4.

As illustrated in FIG. 5, the heat dissipating pad 300 may include the thermal conductive material layer 310 and a plurality of phase change particles 320 in the thermal conductive material layer 310 to have the phase change material. The phase change particles 320 may be surrounded by a capsule 322. A distance between the phase change particles 320 may be about 5 mm. The capsule may include a thermosetting material.

For example, the phase change particles 320 may include a first phase change particle having a first phase change temperature and a second phase change particle having a second phase change temperature different from the first phase change temperature. The first phase change temperature may be in a first temperature range (for example, between 30° C. and 40° C.), and the second phase change temperature may be in a second temperature range (for example, between 40° C. and 50° C.).

Figure 6:
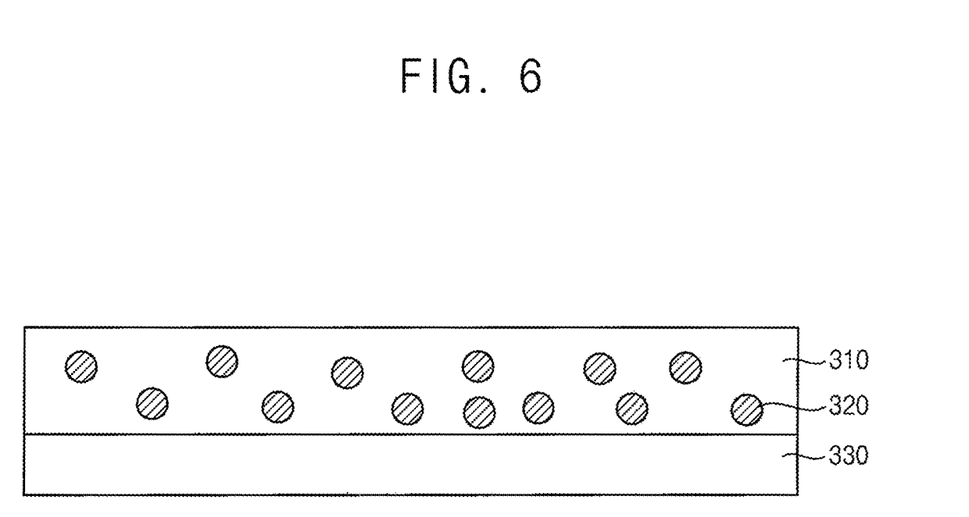

As illustrated in FIG. 6, the heat dissipating pad 300 may include the thermal conductive material layer 310 and a thermal interface material 330 formed on a surface of the thermal conductive material layer 310. The thermal interface material 330 may be in thermal contact with the at least one electronic element. The thermal interface material 330 may serve as a thermal spreader.

The thermal interface material 330 may include a metal material or a thermal interface material (TIM). Examples of the metal material may be copper (Cu), aluminum (Al), etc. Examples of the thermal interface material may be a thermal conductive adhesive tape, a thermal conductive grease, a thermal conductive interface pad, a thermal conductive adhesive, etc.

Figure 7:
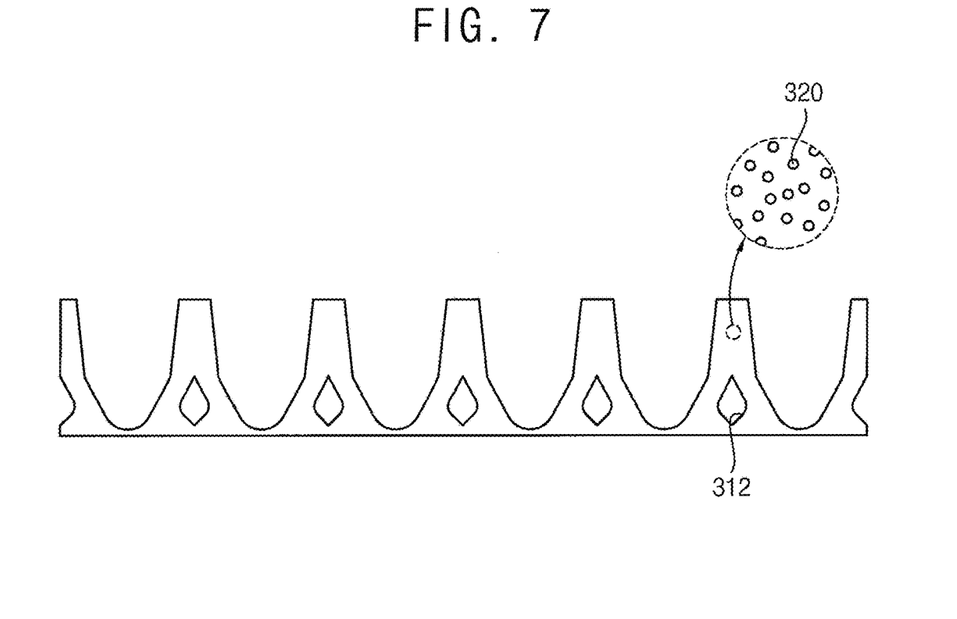

As illustrated in FIG. 7, the thermal conductive material layer 310 may have a structure suitable for external shock absorption. The thermal conductive material layer 310 may have a 3D printed geometric structure. The thermal conductive material layer 310 may have a repetitive support structure pattern. The support structure pattern may have a cavity 312 between end portions.

Figure 8:
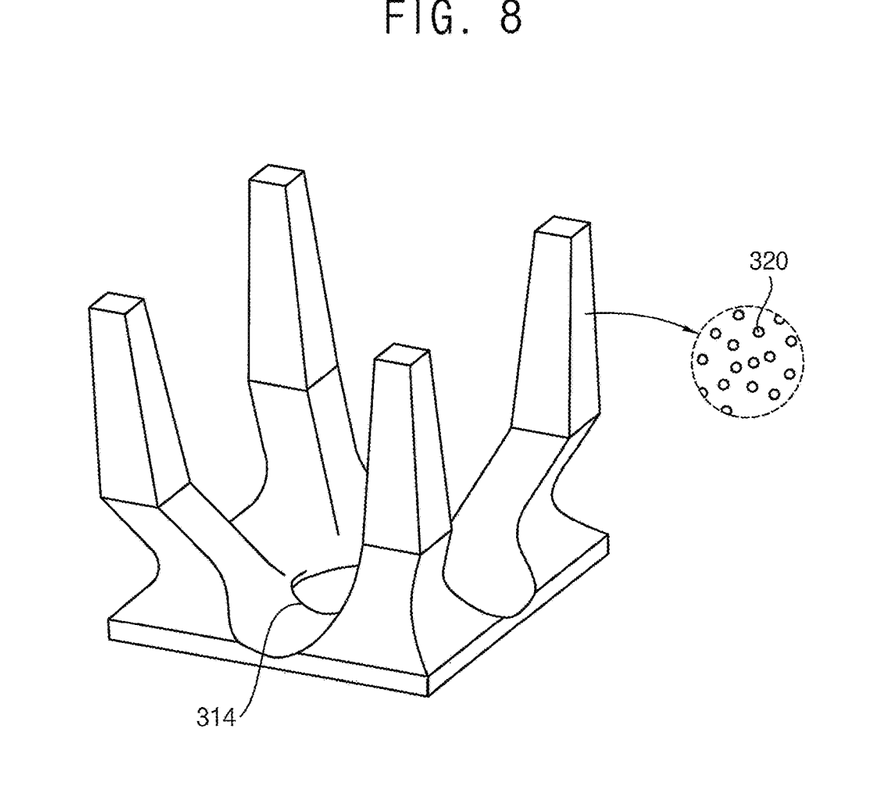

FIG. 8 is a perspective view illustrating a unit structure of a support structure pattern formed in a 3D printed geometric structure. As illustrated in FIG. 8, the thermal conductive material layer 310 may have a plurality of extensions. The extension may have a shape protruding upwardly from a base of the thermal conductive material layer 310. The base may have a through hole 314 in a middle region thereof.

The heat dissipating pad illustrated in FIGS. 7 and 8 may serve as a shock absorber for compensating for external impact.

Although not illustrated in the figures, the thermal conductive material layer 310 may include a porous material having a plurality of pores. In example embodiments, the pore may be filled with phase change particles.

Additionally, the thermal conductive material layer 310 may have at least one space for receiving the phase change material 320. The space may have various shapes such as spherical, polyhedral, and uneven shapes.

Further, the heat dissipating pad 300 may be formed to be flexible or stiff. Thus, hardness of the heat dissipating pad 300 may be adjusted to thereby increase reliability against external impact and/or thermal reliability.

In example embodiments, the bracket 400 may be arranged to cover the substrate 100, the electronic element 200 and/or the heat dissipating pad 300, and the casing 500 may have a structure to surround the bracket 400.

The substrate 100, the electronic element 200 and/or the heat dissipating pad 300 may be fastened to the bracket 400 and the bracket 400 may be inserted into the casing 500, so that the substrate 100, the electronic element 200 and/or the heat dissipating pad 300 may be positioned fixedly within the casing 500. For example, the bracket 400 may include a thermal conductive material. The bracket 400 may serve as a thermal spreader. In case that the bracket 400 has a structure to surround the substrate 100, the electronic element 200 and/or the heat dissipating pad 300, the casing 500 may be omitted and the bracket 400 may replace the casing 500.

In example embodiments, the bracket 400 may include an encapsulated phase change material (Encap. PCM) 420 therein. The bracket 400 may be formed by an injection molding process using a molding resin which includes phase change particles 420 surrounded by capsules. Thus, a heat capacity of the bracket 400 may be increased according to an increase in temperature due to the heat from the hot electronic elements.

At least one recess 402 may be formed in an inner surface of the bracket 400 facing the heat dissipating pad 300. The bracket 400 and the heat dissipating pad 300 may be spaced apart from each other by the recess 402 to form at least one space S.

In example embodiments, the electronic device 10 may further include a coating layer 510 which is coated on the casing 500 and includes an encapsulated phase change material 520. The coating layer 510 may be formed by spraying a coating material including phase change particles 520 surrounded by capsules through a spray nozzle on a surface of the casing 500. The coating layer 510 may be formed on an inner surface or an outer surface of the casing 500.

Additionally, the electronic device 10 may further include a buffer pad (not illustrated) which is arranged between the lower surface of the substrate 100 and the inner surface of the casing 500 to compensate for external impact. The buffer pad may include the encapsulated phase material to serve as the heat dissipating pad.

As mentioned above, the electronic device 10 may include the heat dissipating pad 300 which is configured to absorb and release heat from the electronic elements 200. The heat dissipating pad 300 may include the phase change material (Encap. PCM) encapsulated in the thermal conductive material layer 310 which is in thermal communication with the electronic element 200. A plurality of the phase change particles 320 of the phase change material may be surrounded by the capsules 322 in the thermal conductive material layer 310. The phase change material 320 in solid state may have a first heat capacity coefficient, and the phase change material 320 in liquid state may have a second heat capacity coefficient, higher than the first heat capacity coefficient.

Accordingly, a heat capacity of the heat dissipating pad 300 may be increased according to an increase in temperature due to the heat from the hot electronic elements. Thus, the heat dissipating pad 300 may postpone the time for entering thermal throttling to thereby control skin temperature of the electronic device 10, that is, the surface of the casing 500.

Hereinafter, a method of manufacturing the electronic device will be explained. The method of manufacturing the electronic device may be used for manufacturing a portable SSD. Hereinafter, a case that the electronic device is the portable SSD will be explained. However, it will be understood that the method of manufacturing the electronic device according to example embodiments is not limited thereto.

FIGS. 9 to 12 are views illustrating a method of manufacturing an electronic device in accordance with example embodiments.

Figure 9:
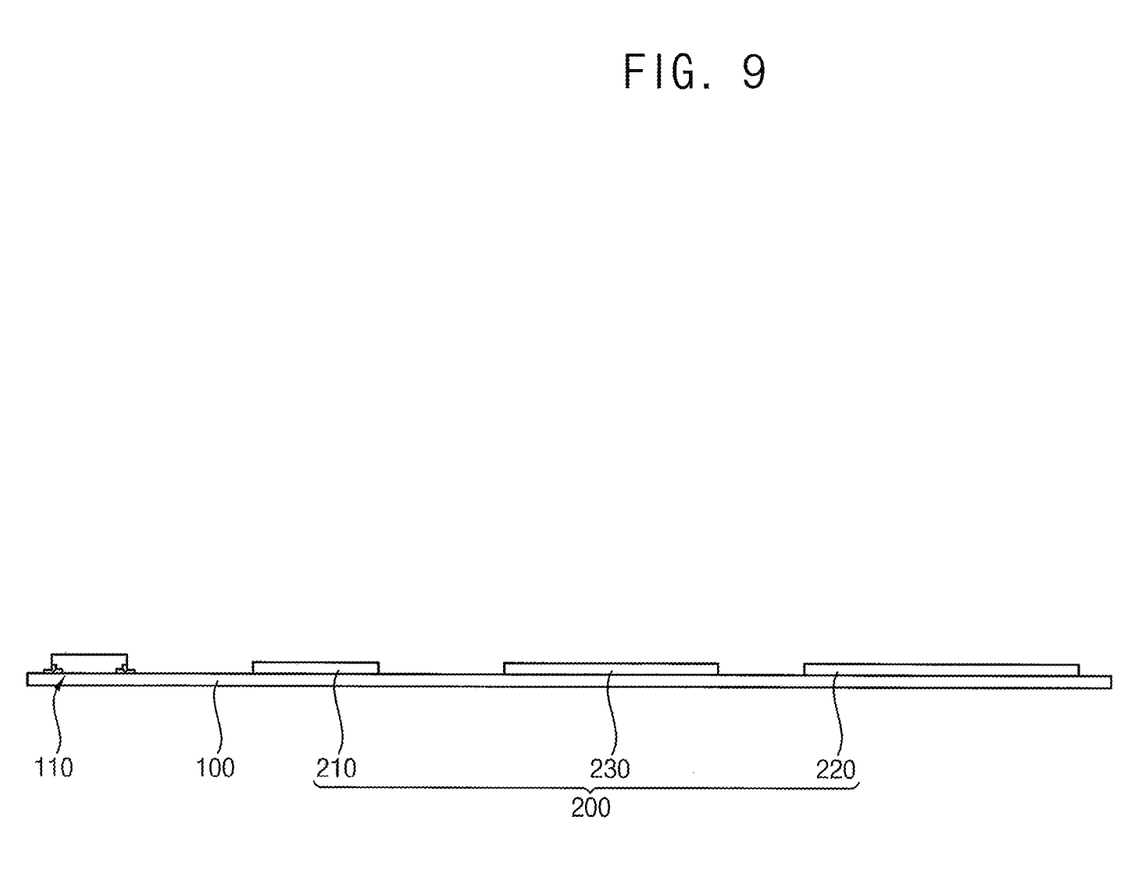
FIGS. 9 to 12 are views illustrating a method of manufacturing an electronic device in accordance with example embodiments.

Referring to FIG. 9, electronic elements 200 may be mounted on a substrate 100.

In example embodiments, a plurality of the electronic elements 200 may be mounted on the substrate 100. The substrate 100 may be a single-layered or multi-layered circuit substrate having an upper surface and a lower surface opposite to each other. For example, the substrate 100 may be a printed circuit board (PCB).

An SSD controller 210, non-volatile memory devices 220 and/or a buffer memory device 230 may be mounted respectively on the upper surface of the substrate 100. For example, the electronic elements 200 may be mounted on the substrate 100 by a flip chip bonding manner. The electronic elements 200 may be mounted on the substrate 100 via conductive bumps, for example, solder bumps.

Figure 10:
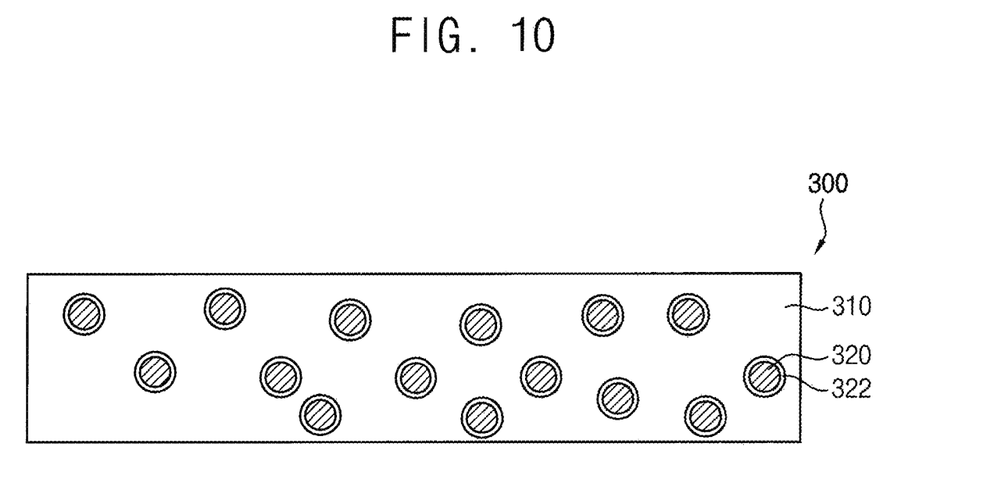

Referring to FIG. 10, a heat dissipating pad 300 may be formed to include an encapsulated phase change material (Encap. PCM) 320 therein, and then, the heat dissipating pad 300 may be arranged on the electronic elements 200 to cover the electronic elements 200.

In example embodiments, after mixing a thermal conductive material and phase change particles 320 surrounded by capsules, a rolling process may be performed to form a thermal conductive material layer 310 including the phase change particles 320 therein.

The thermal conductive material may include a silicon material, a resin material, a thermosetting material, etc. The phase change material may include paraffin, wax, oil, etc. The phase change material in liquid state may have a heat capacity coefficient higher than that of the phase change material in solid state. The phase change material may have a relatively lower thermal conductivity. The thermal conductive material layer may have a thermal conductivity higher than that of the phase change material.

Figure 11:
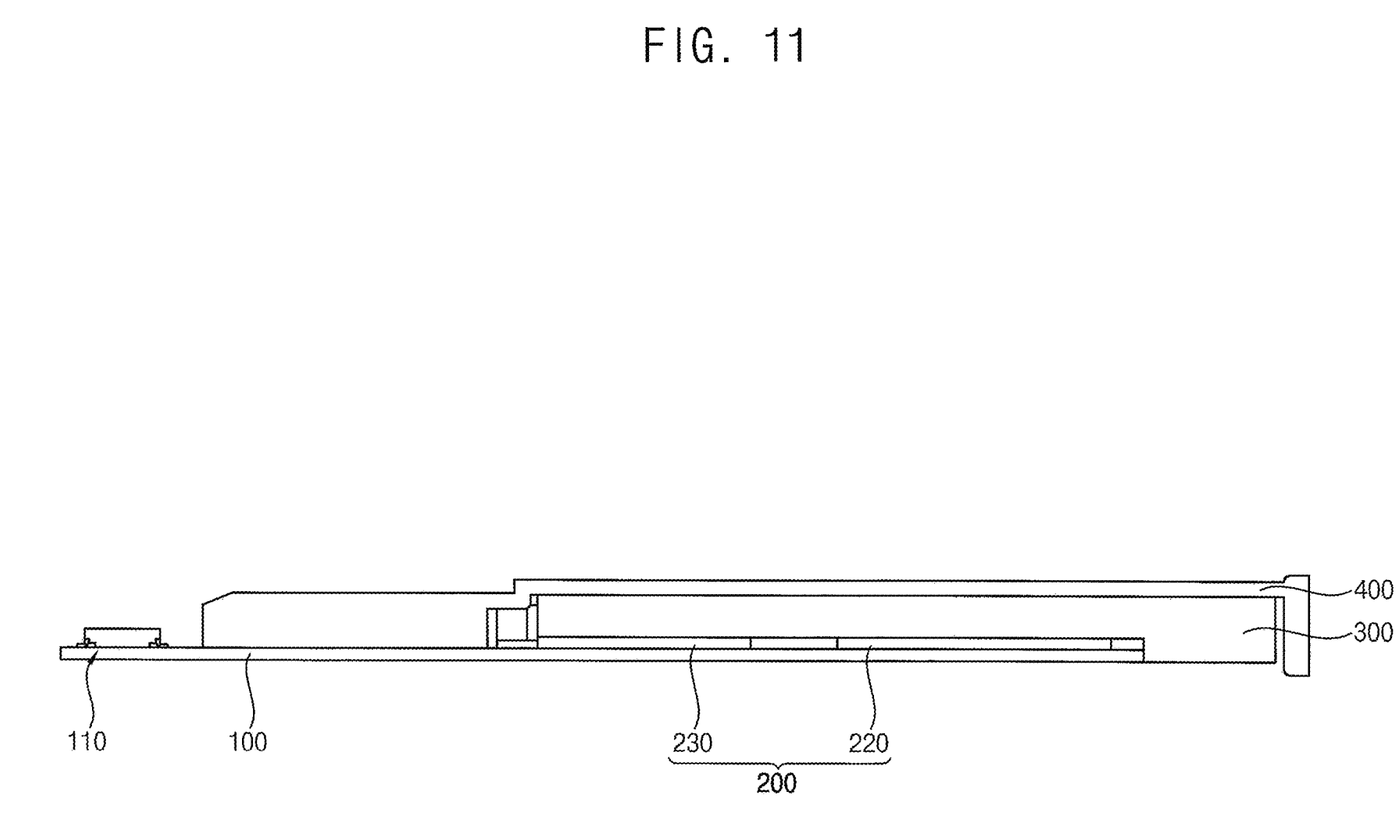
Figure 12:
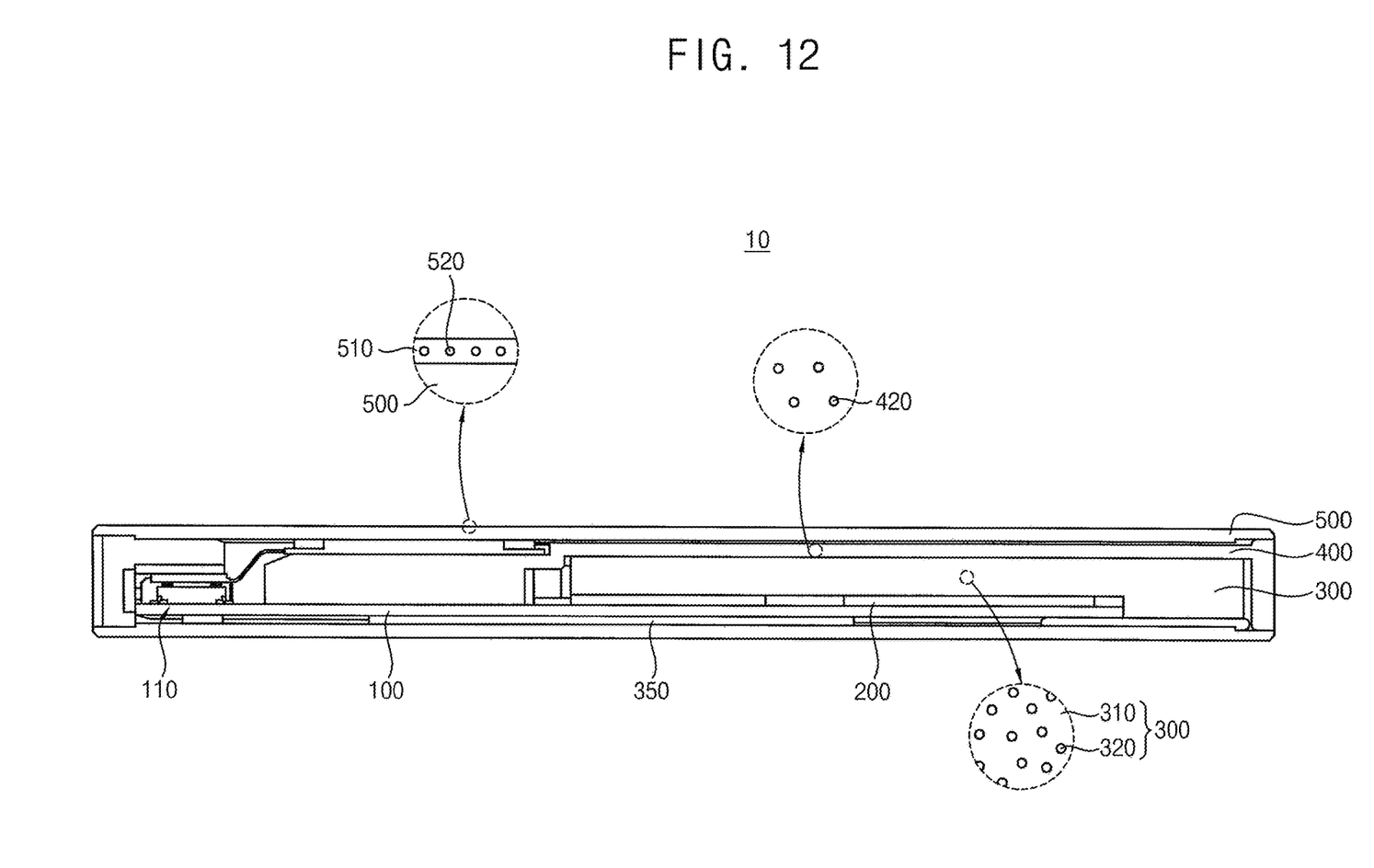

Referring to FIGS. 11 and 12, the heat dissipating pad 300 may be arranged on the electronic elements 200 to cover the electronic elements 200, and then, electronic elements 200 may be placed in a casing 500 using a bracket 400.

In example embodiments, the heat dissipating pad 300 may be disposed on a surface of the bracket 400, and the substrate 100 may be fastened to the bracket 400 with the heat dissipating pad 300 interposed therebetween. Thus, the substrate 100, the electronic element 200 and the heat dissipating pad 300 may be adhered on the bracket 400.

Alternatively, the heat dissipating pad 300 may be adhered on the electronic elements 200 via a thermal interface material. Examples of the thermal interface material may be a thermal conductive adhesive tape, a thermal conductive grease, a thermal conductive interface pad, a thermal conductive adhesive, etc.

The heat dissipating pad 300 may be in thermal contact with the electronic elements 200. When the thermal conductive material layer 310 is heated to, for example, 40° C. by heat from the electronic elements 200, the phase change material may undergo a phase transition from solid to liquid. The phase change material in solid state may have a first heat capacity coefficient, and the phase change material in liquid state may have a second heat capacity coefficient, higher than the first heat capacity coefficient. Thus, a heat capacity of the heat dissipating pad 300 may be increased according to an increase in temperature due to the heat from the hot electronic elements.

In example embodiments, the bracket 400 may include an encapsulated phase change material (Encap. PCM) 420 therein. The bracket 400 may be formed by an injection molding process using a molding resin which includes phase change particles 420 surrounded by capsules. Thus, a heat capacity of the bracket 400 may be increased according to an increase in temperature due to the heat from the hot electronic elements.

At least one recess 402 may be formed or present in an inner surface of the bracket 400 facing the heat dissipating pad 300. The bracket 400 and the heat dissipating pad 300 may be spaced apart from each other by the recess 402 to form at least one space S.

Then, the bracket 400 may be placed in the casing 500 and surrounded by the casing 500.

In example embodiments, a coating layer 510 may be coated on a surface of the casing 500. The coating layer 510 may include an encapsulated phase change material. The coating layer 510 may be formed by spraying a coating material including phase change particles 520 surrounded by capsules through a spray nozzle on the surface of the casing 500. The coating layer 510 may be formed on an inner surface or an outer surface of the casing 500.

Figure 13:
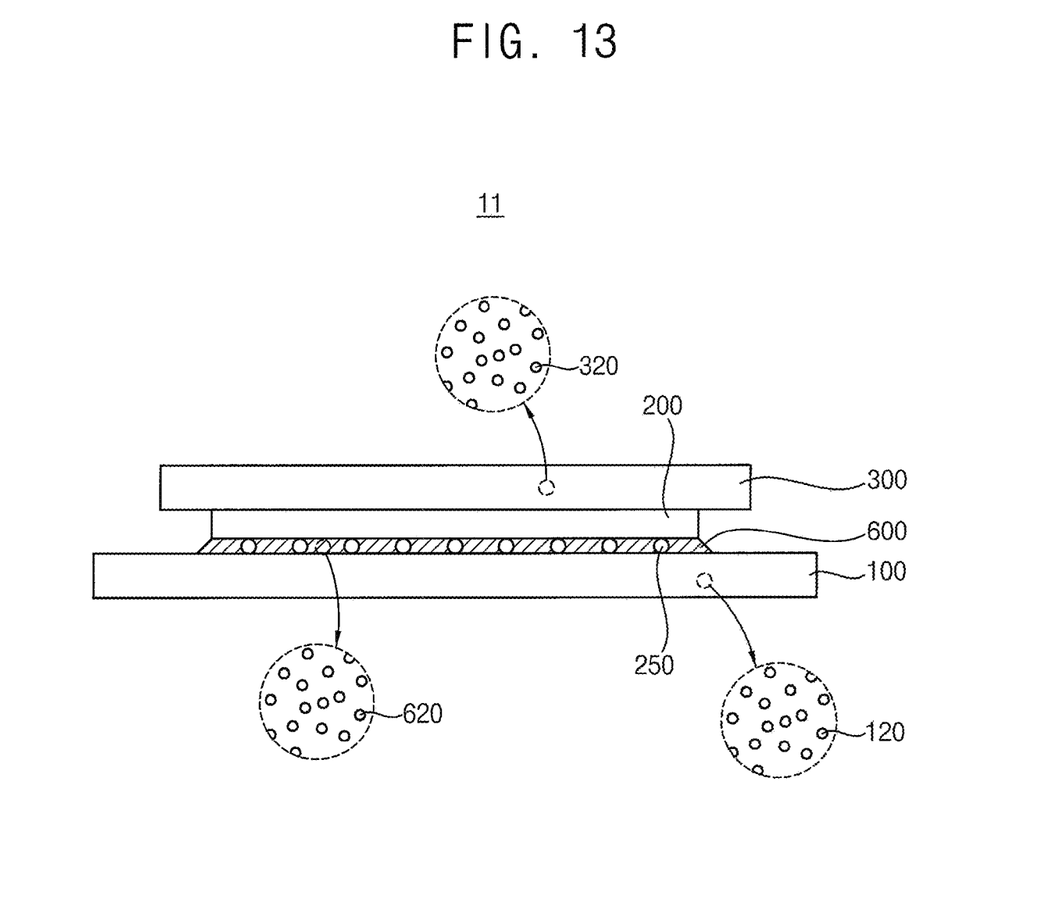
FIG. 13 is a cross-sectional view illustrating an electronic device in accordance with example embodiments.

FIG. 13 is a cross-sectional view illustrating an electronic device in accordance with example embodiments. The electronic device may be the same or substantially the same as or similar to the electronic device described with reference to FIG. 1 except that a substrate or an underfill member includes an encapsulated phase change material. Thus, same reference numerals will be used to refer to the same or like elements and any further repetitive explanation concerning the above elements will be omitted.

Referring to FIG. 13, an electronic device 11 may include a substrate 100, at least one electronic element 200 mounted on the substrate 100, an underfill member 600 interposed between the substrate 100 and the electronic element 200, and/or a heat dissipating pad 300 disposed on the electronic element 200 and being in thermal communication with the electronic element 200. Additionally, the electronic device 11 may further include a housing covering the heat dissipating pad 300.

In example embodiments, the at least one electronic element 200 may be mounted on the substrate 100 by a flip chip bonding manner. Bonding pads of the at least one electronic element 200 may be electrically connected to bonding pads of the substrate 100 by, for example, solder balls 250. The underfill member 600 may be interposed between the substrate 100 and the at least one electronic element 200. The underfill member 600 may include phase change particles 620 surrounded by capsules.

For example, while moving a dispenser nozzle along an end portion of the at least one electronic element 200, an underfill solution including the phase change particles 620 surrounded by the capsules may be dispensed, and then, may be cured to form the underfill member 600. The underfill solution may include a thermosetting material layer such as epoxy. The phase change particle 620 may include a phase change material such as paraffin, wax, oil, etc. The phase change particle 620 may be surrounded by the capsule.

In example embodiments, the substrate 100 may include a substrate core and a wiring layer having a plurality of wirings formed on a surface of the substrate core. The substrate core of the substrate 100 may include phase change particles 120 surrounded by capsules. The substrate core may include a silicon material or a thermosetting material. The phase change particle 120 may include a phase change material such as paraffin, wax, oil, etc. The phase change particle 120 may be surrounded by the capsule.

As mentioned above, the substrate or the underfill member 600 may include an encapsulated phase change material. A plurality of phase change particles of the phase change material 620 may be surrounded by the capsules respectively. Accordingly, a heat capacity of the substrate 100 or the underfill member 600 may be increased according to an increase in temperature due to the heat from the hot electronic elements 200.

The electronic device according to example embodiments may be applied to a portable electronic product such as a portable SSD, a smart phone, a notebook, etc.

The foregoing is illustrative of example embodiments and is not to be construed as limiting thereof. Although a few example embodiments have been described, those skilled in the art will readily appreciate that many modifications are possible in example embodiments without materially departing from the novel teachings and advantages of the inventive concepts. Accordingly, all such modifications are intended to be included within the scope of example embodiments as defined in the claims.

What is claimed is:

1. An electronic device comprising:
   a substrate;
   at least one electronic element on the substrate;
   a heat dissipating pad on the substrate in thermal contact with the at least one electronic element, and including an encapsulated phase change material therein; and
   a bracket covering the substrate, the at least one electronic element and the heat dissipating pad, the bracket directly contacting the substrate and the heat dissipating pad.

2. The electronic device of claim 1, wherein the heat dissipating pad comprises
   a thermal conductive material layer covering the at least one electronic element; and
   a plurality of phase change particles in the thermal conductive material layer, the phase change particles including the phase change material.

3. The electronic device of claim 2, wherein the thermal conductive material layer includes a silicon material or a thermosetting material.

4. The electronic device of claim 2, wherein each of the phase change particles is surrounded by a capsule including a thermal conductive material.

5. The electronic device of claim 2, wherein the thermal conductive material layer has a 3D printed geometric structure, and the geometric structure has a cavity.

6. The electronic device of claim 2, wherein the heat dissipating pad further includes a thermal interface material layer on a surface of the thermal conductive material layer in thermal contact with the electronic element.

7. The electronic device of claim 1, wherein the bracket includes the encapsulated phase change material therein.

8. The electronic device of claim 1, wherein the heat dissipating pad and the bracket are spaced apart from each other to form at least one space.

9. The electronic device of claim 1, further comprising:
   a casing surrounding the bracket.

10. The electronic device of claim 1, further comprising an underfill member between the substrate and the at least one electronic element, and
    wherein at least one of the substrate and the underfill member includes the encapsulated phase change material.

11. An electronic device comprising:
    a substrate;
    at least one electronic element on the substrate;
    a heat dissipating pad on the substrate in thermal contact with the at least one electronic element, and including a thermal conductive material layer covering the at least one electronic element and a plurality of phase change particles in the thermal conductive material layer; and
    a bracket covering the substrate, the at least one electronic element and the heat dissipating pad, the bracket directly contacting the substrate and the heat dissipating pad.

12. The electronic device of claim 11, wherein the plurality of phase change particles each have a phase change temperature range of between about 10° C. and about 100° C.

13. The electronic device of claim 11, wherein each of the phase change particles is surrounded by a capsule including a thermal conductive material.

14. The electronic device of claim 11, wherein the conductive material layer includes a porous material having a cavity.

15. The electronic device of claim 11, wherein the heat dissipating pad and the bracket are spaced apart from each other to form at least one space.

16. A portable solid state drive, comprising:
    a substrate;
    a plurality of non-volatile memory devices on the substrate;
    a heat dissipating pad on the substrate in thermal contact with the non-volatile memory devices, and including a thermal conductive material layer and a plurality of phase change particles in the thermal conductive material layer;
    a bracket covering the substrate, a plurality of the non-volatile memory devices and the heat dissipating pad, the bracket directly contacting the substrate and the heat dissipating pad; and
    a casing surrounding the bracket.

17. The portable solid state drive of claim 16, wherein the phase change particles are each surrounded by a capsule including a thermal conductive material.

18. The portable solid state drive of claim 16, wherein the bracket includes an encapsulated phase change material therein.

19. The portable solid state drive of claim 16, further comprising:
    a coating layer directly on a surface of the casing, the coating layer including an encapsulated phase change material.

20. The portable solid state drive of claim 16, further comprising an underfill member between the substrate and the non-volatile memory devices, and
    wherein at least one of the substrate and the underfill member includes an encapsulated phase change material.

* * * * *